United States Patent
Kamal et al.

(10) Patent No.: US 6,303,503 B1
(45) Date of Patent: Oct. 16, 2001

(54) PROCESS FOR THE FORMATION OF COBALT SALICIDE LAYERS EMPLOYING A SPUTTER ETCH SURFACE PREPARATION STEP

(75) Inventors: Abu-Hena Mostafa Kamal, Sunnyvale, CA (US); Nick S. Argenti, Dansville, NY (US); Christopher Scott Blair, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/418,180

(22) Filed: Oct. 13, 1999

(51) Int. Cl.[7] .................................................. H01L 21/44

(52) U.S. Cl. ..................... 438/682; 438/660; 438/906; 438/677

(58) Field of Search ............................ 438/677, 679, 438/681, 597, 682, 660, 661, 663, 664, 906

(56) References Cited

U.S. PATENT DOCUMENTS 5,915,204 * 6/1999 Sumi ............................... 438/683

OTHER PUBLICATIONS

S. Wolf, *Silicon Processing for the VLSI Era*, Vol. I, pp. 388–399 (Lattice Press, 1986).

T. Yamazaki et al., 21 psec Switching 0.1μm–CMOS at Room Temperture Using High Performance Co Salicide Process, IEDM Tech. Dig., p. 906 (1993).

Q.Z. Hong et al., $CoSi_2$ With Low Diode Leakage and Low Sheet Resistance at 0.065μm Gate Length, IEDM Tech. Dig., p. 107 (1997).

* cited by examiner

*Primary Examiner*—Caridad Everhart
(74) *Attorney, Agent, or Firm*—Stallman & Pollock LLP

(57) ABSTRACT

A process for forming self-aligned cobalt silicide layers on an MOS transistor structure that reduces the risk of creating cobalt silicide bridges between source/drain regions and silicon (e.g. amorphous or polysilicon) gates. The process includes the use of an optimized argon sputter etch surface preparation step prior to cobalt layer deposition. The argon sputter etch step utilizes a DC bias of less than −278 volts in order to insure that backsputtering of silicon onto gate sidewall spacers by the argon ions is minimized. Preferred argon etch sputter steps use a DC bias of less than −80 volts, have a native silicon dioxide etch rate of no more than 5 angstroms per minute and target 20 to 60 angstroms of native silicon dioxide removal. Also provided is a process for preparing the surface of an MOS transistor or structure for subsequent cobalt layer deposition and cobalt salicide formation that includes use of an argon sputter etch process with a DC bias of less than −278 volts.

21 Claims, 4 Drawing Sheets

US 6,303,503 B1

PROCESS FOR THE FORMATION OF COBALT SALICIDE LAYERS EMPLOYING A SPUTTER ETCH SURFACE PREPARATION STEP

BACKGROUND OF THE INVENTION

1. Field of the Invention

The present invention relates to processes for the formation of cobalt salicide layers during semiconductor device fabrication and, in particular, to such processes that include a sputter etch surface preparation step prior to a cobalt layer deposition step.

2. Description of the Related Art

In Metal-Oxide-Semiconductor (MOS) device manufacturing, self-aligned metal silicide layers (also known as "salicide" layers) are useful in reducing the sheet resistance of polysilicon interconnections, source regions and drain regions, as well as contact resistance. See, for example, Stanley Wolf, *Silicon Processing for the VLSI Era*, Vol. I, 388–399 (Lattice Press, 1986).

FIGS. 1–3 illustrate a conventional process for forming a metal silicide layer over a polysilicon gate, a source region and a drain region of an MOS transistor structure. A conventional MOS transistor structure 10 includes a gate oxide layer 12 overlying P-type silicon substrate 14 between N-type drain region 16 and N-type source region 18, both of which are formed in the P-type silicon substrate 14. A conventional MOS transistor structure 10 also includes a polysilicon gate 20 overlying the gate oxide layer 12, as well as shallow trench isolation regions 22. The shallow trench isolation regions 22 isolate the MOS transistor structure 10 from neighboring semiconductor device structures (not shown). Gate sidewall spacers 24, typically formed of silicon dioxide or silicon nitride, are disposed on the lateral surfaces of the polysilicon gate 20 and the gate oxide layer 12.

In a conventional metal silicide layer formation process, a metal layer 28 (typically a titanium layer) is deposited over an MOS transistor structure 10, as illustrated in FIG. 2. Wherever metal layer 28 is in contact with silicon surfaces (i.e. source region 18, drain region 16 and polysilicon gate 20), the metal therein is thermally reacted to form a metal silicide layer. The metal silicide layer formation conditions, such as temperature and gaseous ambient, are selected to foster the reaction of the metal layer with silicon surfaces, while impeding reaction of the metal layer with silicon dioxide or silicon nitride surfaces (i.e. the gate sidewall spacers 24 and shallow trench isolation regions 22). A selective etch is then used to remove unreacted metal from the surfaces of the gate sidewall spacers 24 and shallow trench isolation regions 22, as well as any unreacted metal residue remaining above the source region 18, drain region 16 and polysilicon gate 20. The etch is "selective" since it does not remove the metal silicide layer that was formed on the silicon surfaces. The resultant structure, as illustrated in FIG. 3, includes metal silicide layers 32, 34 and 36 covering the drain region 16, the source region 18 and the polysilicon gate 20, respectively.

The use of cobalt silicide layers is becoming increasingly common in semiconductor devices as an alternative to titanium silicide layers since cobalt silicide layers provide a sheet resistance that is relatively independent of polysilicon gate line width. See, T. Yamazaki et al., 21 *psec Switching 0.1 m-CMOS at Room Temperature Using High Performance Co Salicide Process*, IEDM Tech. Dig., 906 (1993), which is hereby incorporated by reference. The successful formation of cobalt salicide layers on 0.065 micron polysilicon lines, as reported in Q. Z. Hong et al., $CoSi_2$ *With Low Diode Leakage and Low Sheet Resistance at 0.065um Gate Length*, IEDM Tech. Dig., 107 (1997), which is hereby incorporated by reference, indicates that cobalt silicide layers will continue to be utilized in the future. Although Q. Z. Hong et al. reports the use of an in-situ $Ar/H_2$ sputter clean prior to cobalt metal deposition, there is no description or teaching related to the effect of such an Ar sputter clean in device performance or yield.

A drawback of conventional cobalt silicide layer formation processes is the tendency to form cobalt silicide "bridges" on a gate sidewall spacer, connecting a cobalt silicide layer on a polysilicon gate with a cobalt silicide layer on a source region or drain region. The cobalt silicide bridges can result from cobalt silicide overgrowth (i.e. "creep") across the gate sidewall spacer. Such cobalt silicide bridges cause an undesirable electrical short between the polysilicon gate and the source/drain region, thereby decreasing semiconductor device fabrication yield.

In addition, since cobalt can not react with silicon through even a thin layer of native silicon dioxide that is typically present on the surfaces of source regions, drain regions and polysilicon gates, source regions, these surfaces need to be free of native silicon dioxide layers upon cobalt layer deposition. Conventional cobalt silicide formation processes, therefore, typically utilize a wet chemical cleaning step to remove native silicon dioxide layers before depositing a cobalt layer. If the queue time between such a wet chemical cleaning step and the cobalt layer deposition step is lengthy, however, a native silicon dioxide layer may reform, thereby interfering with cobalt silicide layer formation.

Needed in the art is a process for forming a self-aligned cobalt silicide layer on an MOS transistor structure that provides a reduced susceptibility to the formation of cobalt silicide bridges and is tolerant of lengthy queue times between a wet chemical clean step and a cobalt layer deposition step.

SUMMARY OF THE INVENTION

The present invention provides a process for forming cobalt silicide layers on an MOS transistor structure that reduces the risk of cobalt silicide bridges and is tolerant of lengthy queue times between a wet chemical clean step and a cobalt layer deposition step.

A process according to the present invention includes first providing an MOS transistor structure including a silicon substrate (typically P-type), a gate oxide layer on the silicon substrate, and a silicon gate (e.g., a polysilicon gate or an amorphous silicon gate) overlying the gate oxide layer. The MOS transistor structure also includes source and drain regions (typically N-type) disposed in the silicon substrate on either side of the silicon gate. Two gate sidewall spacers (typically fabricated of silicon nitride and/or silicon dioxide) abut lateral surfaces of the silicon gate and gate oxide layer and overly the source and drain regions. The surface of the MOS transistor structure is then prepared using an argon sputter etch process with a DC bias of less than −280 volts.

The argon sputter etch process conditions (e.g. DC bias, silicon dioxide etch rate, and silicon dioxide removal target) are optimized in order to minimize the backsputtering of silicon onto the gate sidewall spacers, while still adequately removing native silicon dioxide from the source region, drain region and silicon gate. This optimization is critical since an argon sputter etch process, if done without any control, can backsputter silicon from source and drain regions that may deposit on the gate sidewall spacers. This backsputtered silicon on the gate sidewall spacers can react with a later deposited cobalt layer to form cobalt silicide bridges, causing an undesirable electrical short between the silicon gate and the source/drain region. Thereby, the cobalt silicide bridges lead to drop in semiconductor device fabrication yield.

Following the argon sputter etch process step, a cobalt layer is deposited on the source region, drain region, silicon gate and gate sidewall spacers. Cobalt in the cobalt layer that is in contact with silicon from the source region, the drain region and the silicon gate is then reacted to form self-aligned cobalt silicide layers thereon. Any unreacted cobalt is subsequently removed.

Also provided by the present invention is a process for preparing the surface of an MOS transistor structure for subsequent cobalt layer deposition and cobalt salicide formation processes. The process according to the present invention includes the step of preparing the surface an MOS transistor structure using an argon sputter etch process with a DC bias of less than −278 volts, prior to cobalt layer deposition and cobalt salicide formation steps.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings of which.

DETAILED DESCRIPTION OF THE INVENTION

Figure 1:
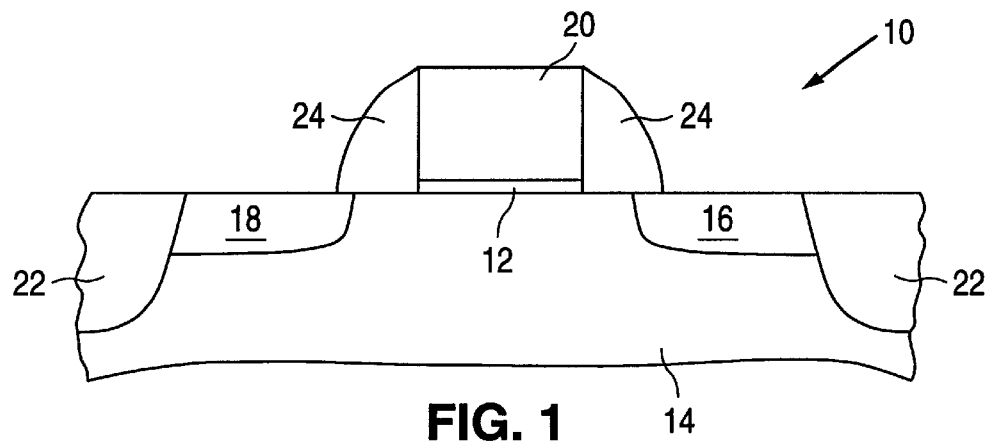
FIG. 1 is a cross-sectional view illustrating a conventional MOS transistor structure prior to the deposition of a metal layer.
Figure 2:
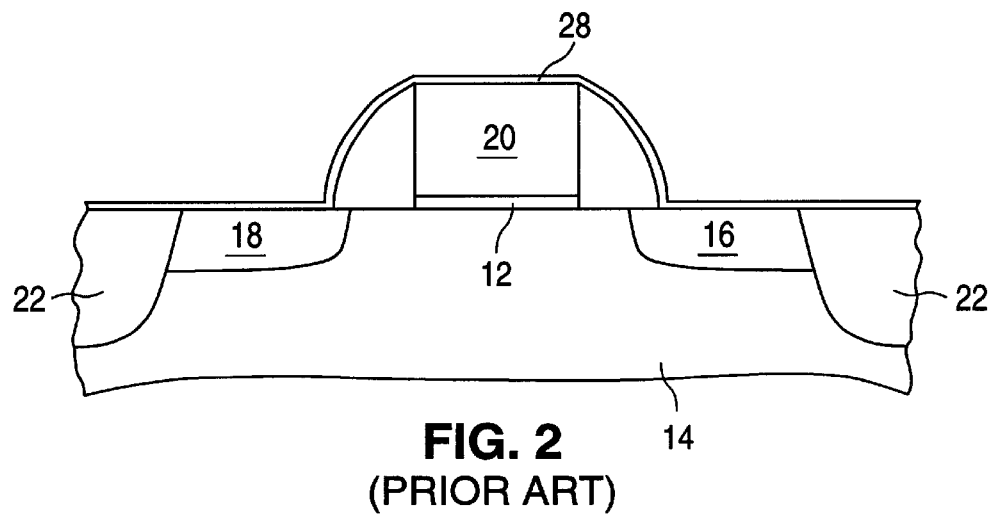
FIG. 2 is a cross-sectional view depicting a conventional MOS transistor structure after deposition of a metal layer.
Figure 3:
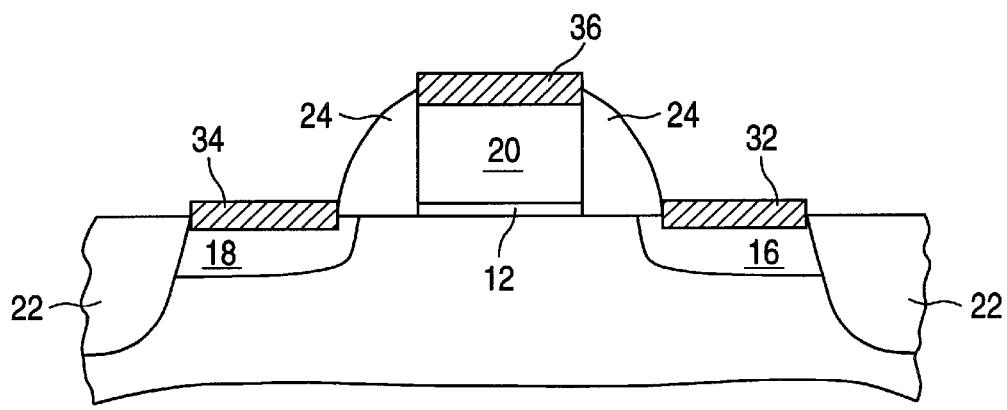
FIG. 3 is a cross-sectional view showing a conventional MOS transistor structure after reacting a metal layer with the silicon surfaces (i.e. the source region, the drain region and the silicon gate).
Figure 4:
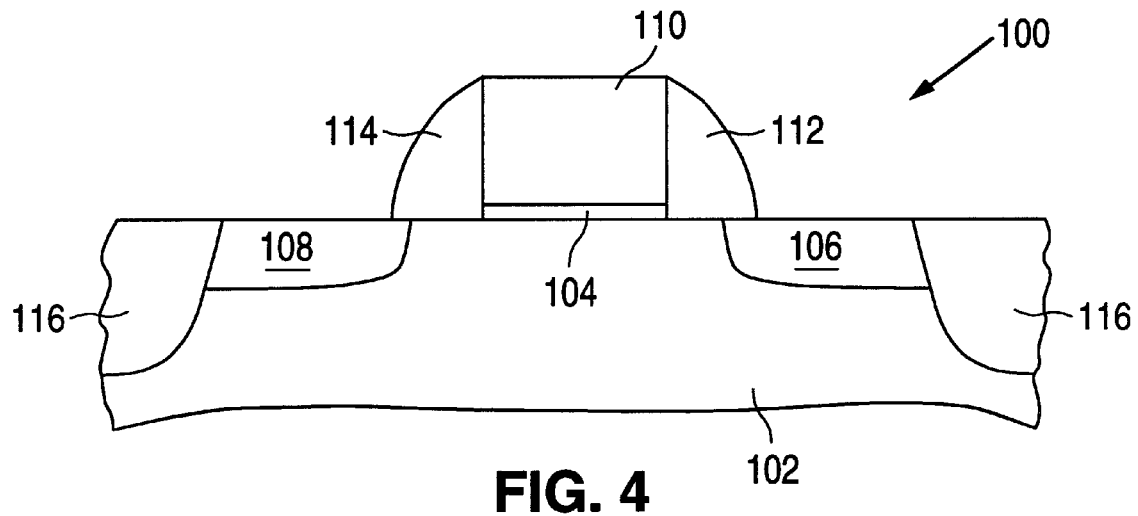
FIGS. 4 is cross-sectional views illustrating a stage in one embodiment of a process according to the present invention.

FIGS. 4 and 6–8 illustrate stages of a process for forming a cobalt silicide layer on an MOS transistor structure according to the present invention. The process includes first providing an MOS transistor structure 100 that includes silicon substrate 102 of a first conductivity type (typically P-type), as shown in FIG. 4. The MOS transistor structure 100 also includes a gate oxide layer 104 (e.g. 40 angstroms thick) overlying the silicon substrate 102 between drain region 106 and source region 108, both of which are formed in the silicon substrate 102. Drain region 106 and source region 108 are of a conductivity type opposite that of the silicon substrate 102. A polysilicon or amorphous silicon gate 110 of typical thickness in the range between 1500 and 2650 angstroms overlies the gate oxide layer 104. MOS transistor structure 100 also includes first gate sidewall spacer 112 and second gate sidewall spacer 114, both of which abut lateral surfaces of the silicon gate 1 10 and the gate oxide layer 104. First gate sidewall spacer 112 extends over the drain region 106, while second gate sidewall spacer 114 extends over the source region 108. The first and second gate sidewall spacers 112 and 114 are made, for example, of CVD silicon nitride, silicon dioxide, or combination of silicon nitride and silicon dioxide, and have a typical width (measured at the bottom of the gate sidewall spacers) in the range of 500 angstroms to 1000 angstroms. Shallow trench isolation regions 116 separate the MOS transistor structure 100 from adjacent MOS transistor structures (not shown).

Next, the surface of MOS transistor structure 100 is cleaned in a conventional manner, such as by the use of RCA and/or HF-based wet chemical cleaning processes. This wet chemical cleaning step (not shown) removes any native silicon dioxide layers covering the drain region 106, the source region 108 and the silicon gate 110 in preparation for the subsequent sputter etch and cobalt layer deposition steps. Native silicon dioxide layers on these silicon surfaces are particularly unwanted since they prevent the reaction of cobalt metal in the cobalt layer with silicon to form a cobalt silicide layer.

Next, the surface the MOS transistor structure is prepared for a subsequent cobalt layer deposition step using an argon sputter etch process with a DC bias of less than −280 volts. The argon sputter etch process step removes any native silicon dioxide layer that remains on the surface after the wet chemical cleaning step or that has reformed due to a lengthy queue (i.e. lag) time following the cleaning step. The argon sputter etch process is conducted under a DC bias of less than −278 volts in order to avoid excessive backsputtering of silicon from the source and drain regions onto the gate sidewall spacers, thereby preventing cobalt silicide bridges. Through physical sputtering by argon atoms ($Ar^+$), the argon sputter etch step included in processes according to the present invention is capable of removing not only silicon dioxide, but also any elemental components that are covering the MOS transistor structure and in the argon atoms' path. The use of an argon sputter etch step is especially beneficial in providing silicon surfaces free of native silicon dioxide layer when manufacturing constraints create a long delay (i.e. a long queue time) between the wet chemical cleaning step and the cobalt deposition step.

Through experimental analyses described below, it has been determined that silicon from source regions or drain regions can be backsputtered onto gate sidewall spacers and result in the formation of cobalt silicide bridges between silicon gate and source/drain regions. In processes according to the present invention, the argon sputter etch step is optimized (via control of the DC bias employed in the argon sputter etch process) to minimize the amount of silicon that is backsputtered onto gate sidewall spacers, thereby preventing the cobalt silicide bridge formation, while still providing adequate native silicon dioxide removal.

The amount of silicon backsputtering onto gate sidewall spacers that occurs during the argon sputter etch step is dependent upon the amount of energy transmitted from incoming $Ar^+$ ions to surface silicon atoms (i.e. in the source regions, drain regions and silicon gates) and the spacing between silicon gates. The higher the energy of the incoming Ar⁺ ions, the greater the amount of backsputtered silicon. In addition, the narrower the spacing between silicon gates, the greater the likelihood of backsputtered silicon to collide with, and adhere to, a gate sidewall spacer, instead of being removed from the sputter etch equipment chamber. As the spacing between silicon gates decreases in state of the semiconductor fabrication technologies, smaller DC biases are required to insure that the amount of backsputtered silicon adhering to the gate sidewall spacers is inadequate to result in cobalt silicide bridges.

Figure 5:
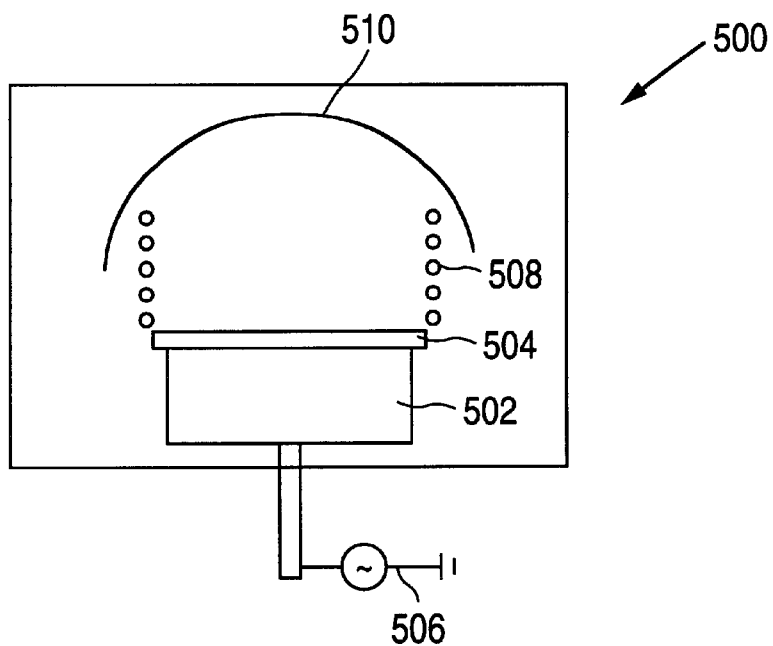
FIG. 5 is a schematic representation of a sputter etch equipment chamber for use in processes according to the present invention.

The argon sputter etch surface preparation step can be conducted in conventional sputtering equipment, such as the sputter etch equipment chamber 500 shown in FIG. 5. Sputter etch equipment chamber 500 includes a wafer pedestal 502 for holding a silicon substrate 504 (e.g. a silicon wafer), a radio frequency (RF) power generator 506 for supplying radio frequency (RF) power to the wafer pedestal 502, an RF power coil 508 and a quartz dome 510. In the sputter etch equipment chamber of FIG. 5, the argon sputter etch process is conducted by applying a 13.56 MHz RF power to the wafer pedestal 502 and a 400 KHz power to the RF power coil 508. A plasma is then generated, within the quartz dome 510, that includes argon neutral atoms, argon ions (Ar⁺) and electrons. At the start of the argon sputter etch process, due to the applied RF power, the silicon substrate 504 switches back and forth between being positively biased and negatively biased. When the silicon substrate 504 is positively biased, it attracts many electrons to its surface. On the other hand, when the silicon substrate 504 is negatively biased, it attracts fewer electrons. As a result, a negative DC bias (i.e. a "self-bias") develops on the silicon substrate 504 which attracts argon ions (Ar⁺) towards its surface. The physical bombardment of argon ions on the silicon substrate surface results in a transfer of momentum from the argon ions to atoms (such as native silicon dioxide and silicon atoms) present on the silicon substrate surface. The amount of energy transferred from the argon ions to these atoms increases with an increase in the magnitude of the self-bias and decreases with a decrease in the magnitude thereof.

The DC bias of the argon sputter etch step and, therefore, the amount of silicon backsputtered onto the gate sidewall spacers, can be controlled by manipulating the amount of RF power supplied to the RF power coil 508 and the wafer pedestal 502. In general, the ratio of RF power supplied to RF power coil 508 to that supplied to the wafer pedestal 502 is inversely proportional to the DC bias. As the ratio increases, the DC bias decreases (i.e. become less negative), thereby resulting in lower-energy transfer to backsputtered silicon. As the ratio decreases, the DC bias increases (i.e. becomes more negative), thereby resulting in higher-energy transfer to backsputtered silicon.

Throughout this disclosure, a "hard" argon sputter etch refers to an argon sputter etch step conducted under conditions which result in a relatively high DC bias and, therefore a relatively large amount of silicon backsputtering. A "soft" argon sputter etch" refers to an argon sputter etch step conducted under conditions which result in a relatively low DC bias of less than −278 volts, and preferably less than −80 volts and more preferably less than −50 volts, and therefore, a relatively small amount of silicon backsputtering. Particularly useful "soft" argon sputter etch processes are those having native silicon dioxide etch rates ranging from 5 angstroms per second to less than 10 angstroms per second and with native silicon dioxide removal targets of between 20 and 60 angstroms.

Figure 6:
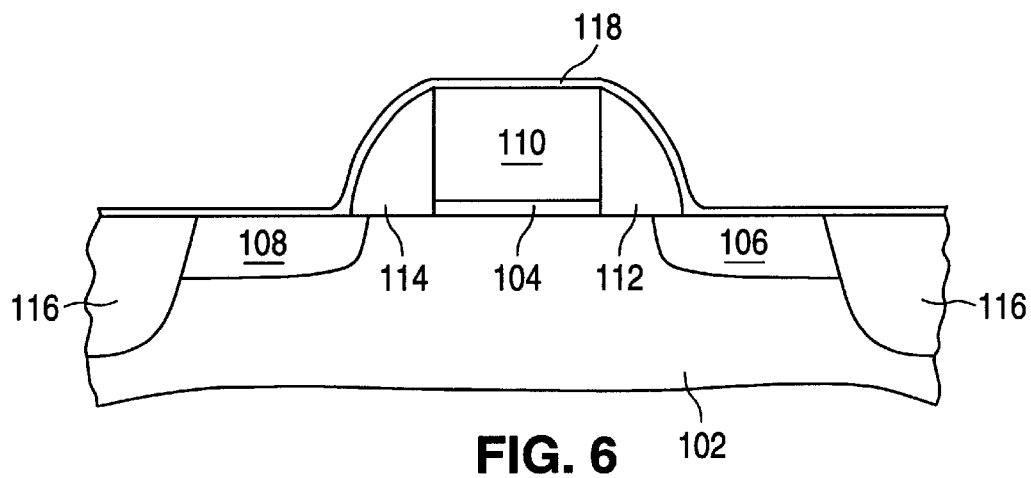
FIGS. 6–8 are cross-sectional views illustrating stages in one embodiment of a process according to the present invention.

Next, a cobalt layer 118 is deposited over the MOS transistor structure 100 completely covering the drain region 106, source region 108, silicon gate 110, shallow trench isolation regions 116, first gate sidewall spacer 112 and second gate sidewall spacer 114. The resultant structure is illustrated in FIG. 6. The cobalt layer thickness is preferably in the range of 90 to 110 angstroms. Cobalt layer 118 can be deposited by any process known in the art, for example sputtering or chemical vapor deposition.

Figure 7:
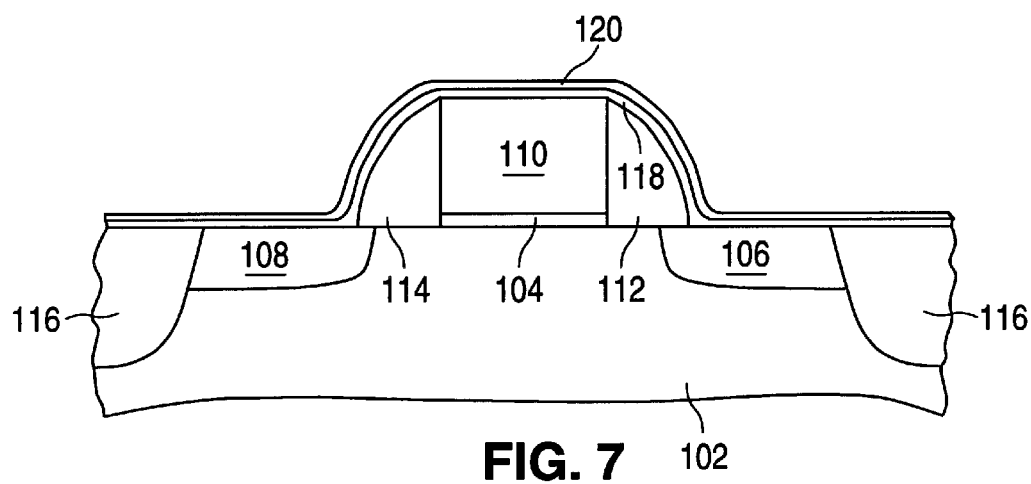
Figure 8:
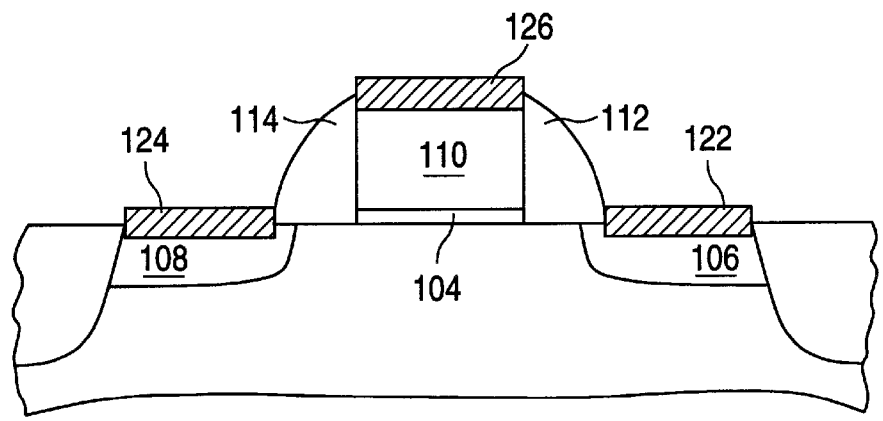

It can be beneficial to utilize a bilayer system upon cobalt silicide layer formation. In the bilayer system, a deposited cobalt layer is subsequently covered with a "capping" layer of titanium, titanium-tungsten (TiW), or titanium-nitride (TiN), prior to the reaction of the cobalt with silicon in the underlying silicon surfaces to form cobalt silicide layers. The use of such capping layers is reported to improve device electrical parameters, to reduce cobalt overgrowth on the gate sidewall spacers and, in the case of titanium capping layers, to provide a gettering mechanism that prevents unwanted cobalt oxidation during the silicide formation process. In the case of bilayer system, a titanium capping layer 120 (typically 75±7 angstroms in thickness) is then deposited over cobalt layer 118 using conventional sputtering techniques. The resultant structure is illustrated in FIG. 7.

Cobalt in the cobalt layer 118 that is in direct contact with silicon in the drain region 106, source region 108, and silicon gate 110 is reacted to form self-aligned cobalt silicide (CoSi) layers 122, 124, 126 thereon, respectively. The term "self-aligned" refers to the fact that the cobalt silicide layers 122, 124 and 126, being the products of a reaction between cobalt and silicon, are "self-aligned" to the silicon surfaces of the drain region 106, source region 108, and silicon gate 110, respectively. The cobalt-silicon reaction can be conducted using procedures well known to those skilled in the art. Typical procedures employ elevated temperatures, for example 510–540° C., in nitrogen ($N_2$) for 30 to 90 seconds, in order to foster the cobalt silicide formation and the reactions are normally conducted in a rapid thermal processor (RTP).

Next, unreacted cobalt in the cobalt layer 118 from the cobalt-silicon reaction and the titanium capping layer 120 are removed using a conventional selective wet etch, such as a 2:3 ratio mixture of phosphoric acid ($H_3PO_4$) and hydrogen peroxide ($H_2O_2$) for a period of 20 minutes. The resultant structure, illustrated in FIG. 8, includes self-aligned cobalt silicide (CoSi) layers 122, 124 and 126 on the drain region 106, the source region 108, and the silicon gate 110, respectively.

A second thermal step is subsequently used to convert the cobalt silicide (CoSi) layers to more stable cobalt silicide ($CoSi_2$) layers that provide the desired low sheet resistance. This second thermal step can be conducted, for example, in an RTP at 800–830° C. for 30 to 90 seconds in an $N_2$ ambient.

Figure 9:
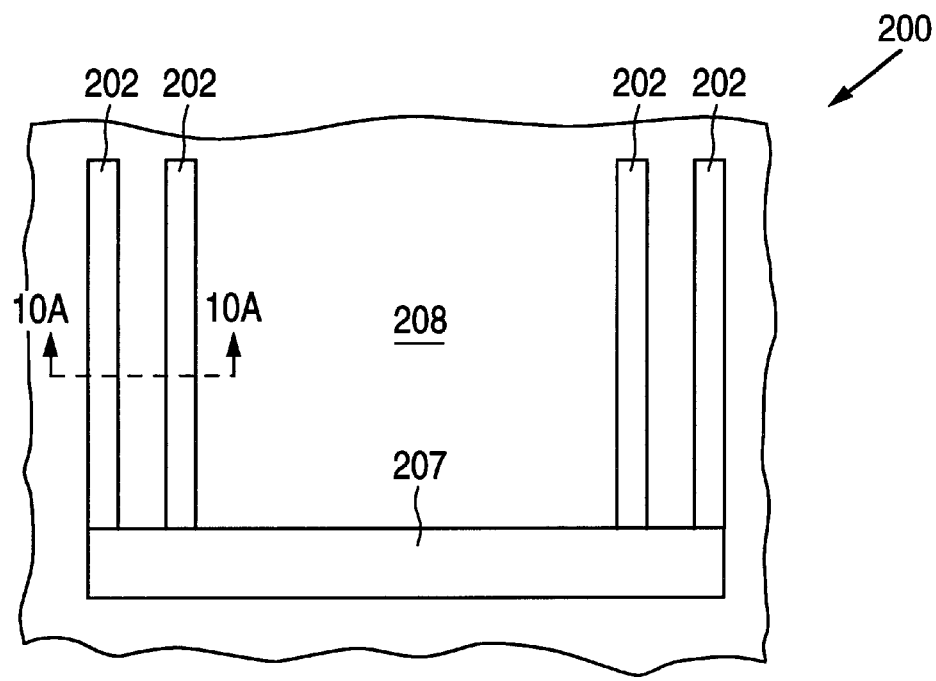
FIG. 9 is a layout view of a polysilicon gate "finger" test structures.
Figure 10:
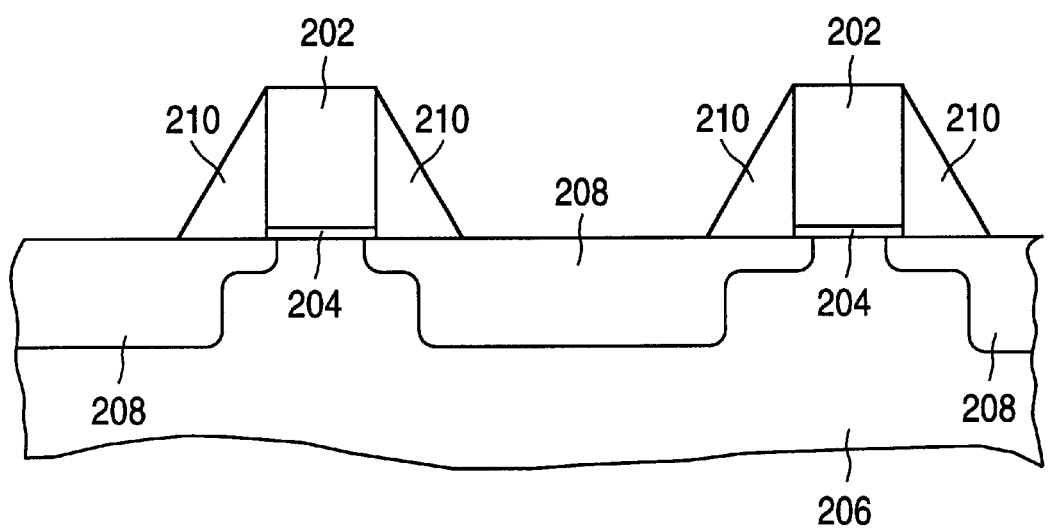
FIG. 10 is a cross-sectional schematic of a polysilicon gate "finger" test structure taken along line 10A—10A of FIG. 9.

To verify that processes in accordance with the present invention provide for the formation of cobalt silicide layers on MOS transistor structures that are free from cobalt silicide bridges, a series of 10 meter long polysilicon gate test structures were prepared and characterized. The test structure 200 (which mimics a MOS transistor structures) includes 2500 angstrom thick polysilicon gate "fingers" 202 with 10 m of edge length and 0.18 microns of width overlying a 40 angstrom gate oxide layer 204 and a P-type silicon substrate wafer 206, as illustrated in FIGS. 9 and 10. The polysilicon gate fingers 202 are connected to a doped polysilicon pad region 207. N-type composite regions 208 are present in P-type silicon substrate wafer 206. The width of gate sidewall spacers 210, which was composed of a silicon nitride/silicon dioxide bilayer, was 0.8 microns. The spacing between adjacent polysilicon gates fingers 202 (i.e. polysilicon "lines") was 0.38 microns.

The test structures were initially cleaned using a conventional RCA and HF process that targeted 250 angstroms of native silicon dioxide removal (i.e., $H_2O:NH_4OH:H_2O_2$ mixture at a ratio of 80:2.2:3.1 and 35° C. for 60 seconds, followed by a water rinse and a $H_2O:HCl:H_2O_2$ mixture at a ratio of 80:4.0:2.2 and 45° C. for 60 seconds, a rinse and a $H_2O$:HF mixture at a ratio of 100:1 and 25° C. for 90 seconds). Selected test structures were subsequently subjected to in-situ argon sputter etch processes performed in an Applied Materials Endura 5500 PCII chamber, followed by a cobalt layer deposition in Applied Materials Endura 5500 wide body PVD chamber with a A101 wafer pedestal and a titanium capping layer deposition. The deposited cobalt layer was approximately 100 angstroms thick, while the deposited titanium capping layer was approximately 75 angstroms thick. Self-aligned cobalt silicide layers were then formed using conventional thermal processes, as described above.

Table 1 below lists the polysilicon gate finger to composite leakage current (i.e. also known as "gate to source or drain" leakage current) of 10 meter polysilicon gate finger test structures for various argon sputter etch surface preparation conditions. The polysilicon gate finger to composite leakage was measured using a polysilicon gate finger voltage of 2.0V with the silicon substrate floating.

The data in Table 1 demonstrate that the average polysilicon gate finger to composite leakage current and standard deviation thereof are most favorable (i.e. minimized) for the "soft" sputter etch test condition and least favorable (i.e. maximized) for the "hard" sputter etch test condition.

TABLE 1

|  | Test Condition | | |
| --- | --- | --- | --- |
|  | Soft Sputter Etch | Hard Sputter Etch | No Sputter Etch |
| RF Power | 200 W | 330 W | — |
| Pedestal Power | 200 W | 330 W | — |
| DC Bias Voltage | −278 V | −308 V | — |
| SiO2 Etch Rate | 5 Å/sec. | 9.6 Å/sec. | — |
| Average Polysilicon Gate Finger to Composite Leakage | E-10.58 amps | E-8.09 amps | E-10.61 amps |
| 3-sigma Deviation of Polysilicon Gate Finger to Composite Leakage | E0.84 amps | E6.49 amps | E4.16 amps |

Transmission Electron Microscopy (TEM) cross-section images of test structures which received no argon sputter etch, but on which cobalt layer was deposited immediately after native silicon dioxide was removed via RCA and HF-based cleaning, showed no sign of cobalt silicide bridges on the gate sidewall spacers. However, test structures that receive no argon sputter etch are susceptible to native silicon dioxide reformation and are, consequently, more likely to have poor cobalt silicide formation on the source regions, drain regions and polysilicon gate.

TEM cross-section images of two test structures both of which received a soft argon sputter etch (as defined in Table 1), one with a native silicon dioxide removal target of 40 angstroms and the other with a native silicon dioxide removal target of 80 angstroms, prior to cobalt layer deposition were analyzed. The analysis revealed the presence of discrete globules of cobalt silicide ($CoSi_2$) on the lower portion of the gate sidewall spacers on each of the two test structures. The number of discrete globules on the test structure processed with a native silicon dioxide removal target of 40 angstroms was, however, significantly less than that of the test structure processed with a native silicon dioxide removal target of 80 angstroms. A continuous cobalt silicide ($CoSi_2$) bridge was, however, not observed in either test structure.

Analysis of TEM cross-section images of a test structure which received a hard argon sputter etch (as defined in Table 1) with a native silicon dioxide removal target of 80 angstroms indicated the presence of a relatively thick (approximately 80 angstrom) layer of cobalt silicide ($CoSi_2$) on the gate sidewall spacer. Although a continuous cobalt silicide ($CoSi_2$) bridge from polysilicon gate finger to composite was not observed in the TEM cross-section image of the test structure, the leakage data of Table 1 indicates that there must be locations along the 10 meter long polysilicon gate fingers where continuous cobalt silicide bridges exist.

A cobalt silicide layer was not observed to extend from the polysilicon gate finger onto a gate sidewall spacer in any of the TEM cross-section images of the test structures described above. This observation indicates that any cobalt silicide formation, be it a discrete globule or a bridge, on the gate sidewall spacer is not due to cobalt silicide creep from the polysilicon gate finger. Rather, such cobalt silicide formation is more likely due to the presence of silicon on the gate sidewall spacer that has been backsputtered during the argon sputter etch surface preparation step.

It should be understood that various alternatives to the embodiments of the invention described herein may be employed in practicing the invention. It is intended that the following claims define the scope of the invention and that processes within the scope of these claims and their equivalents be covered thereby.

What is claimed is:

1. A method for forming self-aligned cobalt silicide layers on an MOS transistor structure comprising the steps of:
   providing an MOS transistor structure comprising:
   a silicon substrate of a first conductivity type;
   a gate oxide layer on the silicon substrate;
   a silicon gate overlying the gate oxide layer;
   source and drain regions of a second conductivity type in the silicon substrate; and
   a gate sidewall spacer abutting lateral surfaces of the silicon gate and the gate oxide layer;
   argon sputter etching the MOS transistor structure surface with a DC bias of less than −278 volts;
   depositing a cobalt layer on the source region, the drain regions, the silicon gate, the gate sidewall spacer; and
   reacting cobalt from the cobalt layer with silicon from the source region, the drain region and the silicon gate to yield self-aligned cobalt silicide layers on the source region, drain region and silicon gate.

2. The method of claim 1 wherein the argon sputter etching step is conducted in-situ with the depositing step.

3. The method of claim 1 wherein the argon sputter etching step includes argon sputter etching the MOS transistor structure surface with a DC bias of less than −80 volts.

4. The method of claim 1 wherein the argon sputter etching step includes argon sputter etching the MOS transistor structure surface with a DC bias of less than −50 volts.

5. The method of claim 4 wherein the argon sputter etching step includes argon sputter etching the MOS transistor structure surface with a targeted native silicon dioxide layer removal in the range of 20 to 60 angstroms.

6. The method of claim 1 wherein the argon sputter etching step includes argon sputter etching the MOS transistor structure surface with a targeted native silicon dioxide layer removal of less than 80 angstroms.

7. The method of claim 1 wherein the argon sputter etching step includes argon sputter etching the MOS transistor structure surface with a native silicon dioxide etch rate of less than 9.6 angstroms per second.

8. The method of claim 1 wherein the argon sputter etching step includes argon sputter etching the MOS transistor structure surface with a native silicon dioxide etch rate of less than 5 angstroms per second.

9. The method of claim 1 wherein the argon sputter etching step includes argon sputter etching the MOS transistor structure surface with a silicon dioxide etch rate of less than 5 angstroms per second and a targeted native silicon dioxide layer removal in the range of 20 to 60 angstroms.

10. The method of claim 1 wherein the argon sputter etching step backsputters silicon from the MOS transistor structure surface in an amount insufficient to form cobalt silicide bridges during the subsequent cobalt salicide formation.

11. The method of claim 1 further including the step of removing unreacted cobalt after the reacting step.

12. The method of claim 1 further including the step of cleaning the MOS transistor structure surface with an HF-based process prior to the argon sputter etching step.

13. A method for preparing the surface of an MOS transistor structure for subsequent cobalt layer deposition and cobalt salicide formation processes, the method comprising the step of:

argon sputter etching the MOS transistor structure surface with a DC bias of less than −278 volts, prior to the cobalt layer deposition and the cobalt salicide formation;

whereby silicon backsputtering during the argon sputter etching step is minimized and a subsequently formed cobalt salicide layer is free of cobalt silicide bridges.

14. The method of claim 13 wherein the argon sputter etching step is conducted in-situ with the cobalt layer deposition.

15. The method of claim 13 wherein the argon sputter etching step includes argon sputter etching the MOS transistor structure surface with a DC bias of less than −80 volts.

16. The method of claim 13 wherein the argon sputter etching step includes argon sputter etching the MOS transistor structure surface with a DC bias of less than −50 volts.

17. The method of claim 13 wherein the argon sputter etching step includes argon sputter etching the MOS transistor structure surface with a targeted native silicon dioxide layer removal of less than 80 angstroms.

18. The method of claim 13 wherein the argon sputter etching step includes argon sputter etching the MOS transistor structure surface with a targeted native silicon dioxide layer removal in the range of 20 to 60 angstroms.

19. The method of claim 13 wherein the argon sputter etching step includes argon sputter etching the MOS transistor structure surface with a silicon dioxide etch rate of less than 5 angstroms per second.

20. The method of claim 13 wherein the argon sputter etching step includes argon sputter etching the MOS transistor structure surface with a silicon dioxide etch rate of less than 5 angstroms per second and a targeted native silicon dioxide layer removal in the range of 20 to 60 angstroms.

21. The method of claim 13 wherein the argon sputter etching step backsputters silicon from the MOS transistor structure surface in an amount insufficient to form cobalt silicide bridges during the subsequent cobalt salicide formation.

* * * * *